US010692775B2

(12) United States Patent
Sung et al.

(10) Patent No.: US 10,692,775 B2
(45) Date of Patent: Jun. 23, 2020

(54) FIN DAMAGE REDUCTION DURING PUNCH THROUGH IMPLANTATION OF FINFET DEVICE

(71) Applicant: APPLIED Materials, Inc., Santa Clara, CA (US)

(72) Inventors: Min Gyu Sung, Essex, MA (US); Jae Young Lee, Bedford, MA (US); Johannes Van Meer, Middleton, MA (US); Sony Varghese, Manchester, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/186,004

(22) Filed: Nov. 9, 2018

(65) Prior Publication Data

US 2020/0152519 A1   May 14, 2020

(51) Int. Cl.
| | |
|---|---|
| *H01L 21/82* | (2006.01) |
| *H01L 21/8234* | (2006.01) |
| *H01L 21/768* | (2006.01) |
| *H01L 29/10* | (2006.01) |
| *H01L 27/088* | (2006.01) |
| *H01L 29/78* | (2006.01) |

(52) U.S. Cl.
CPC .......... *H01L 21/823481* (2013.01); *H01L 21/76829* (2013.01); *H01L 21/823431* (2013.01); *H01L 27/0886* (2013.01); *H01L 29/1083* (2013.01); *H01L 29/7851* (2013.01)

(58) Field of Classification Search
CPC ....... H01L 21/823481; H01L 21/76829; H01L 21/823431; H01L 27/0886; H01L 29/1083; H01L 29/7851
USPC .................................................. 438/400
See application file for complete search history.

(56) References Cited

U.S. PATENT DOCUMENTS

| | | | |
|---|---|---|---|
| 8,860,148 B2 | 10/2014 | Hu et al. | |
| 9,799,570 B1* | 10/2017 | Cheng | ............ H01L 21/823878 |
| 9,812,358 B1 | 11/2017 | Huang et al. | |
| 2013/0277746 A1* | 10/2013 | Baldauf | .......... H01L 21/823807 |
| | | | 257/368 |
| 2014/0110755 A1 | 4/2014 | Colinge | |
| 2014/0124842 A1 | 5/2014 | Wang et al. | |
| 2015/0041854 A1 | 2/2015 | Wang et al. | |
| 2015/0311342 A1* | 10/2015 | Lin | ................... H01L 29/66659 |
| | | | 257/190 |
| 2016/0148935 A1* | 5/2016 | Chen | ................... H01L 29/4966 |
| | | | 257/369 |

(Continued)

*Primary Examiner* — Sheikh Maruf

(57) ABSTRACT

Disclosed are methods of forming a semiconductor device, such as a finFET device. One non-limiting method may include providing a semiconductor device including a substrate and a plurality of fins extending from the substrate, and forming a source trench isolation (STI) material over the semiconductor device. The method may further include recessing the STI material to reveal an upper portion of the plurality of fins, implanting the semiconductor device, and forming a capping layer over the plurality of fins and the STI material. The method may further include removing a first fin section of the plurality of fins and a first portion of the capping layer, wherein a second fin section of the plurality of fins remains following removal of the first fin section.

18 Claims, 6 Drawing Sheets

(56) References Cited

U.S. PATENT DOCUMENTS

| | | | |
|---|---|---|---|
| 2016/0315082 A1 | 10/2016 | Huang | |
| 2017/0117187 A1 | 4/2017 | Ando et al. | |
| 2017/0207126 A1* | 7/2017 | Ching | H01L 29/7848 |
| 2017/0278717 A1* | 9/2017 | Wu | H01L 21/823437 |
| 2017/0278928 A1* | 9/2017 | Tung | H01L 29/785 |
| 2017/0309624 A1* | 10/2017 | Cheng | H01L 21/30604 |
| 2018/0006111 A1* | 1/2018 | Xie | H01L 29/66795 |
| 2018/0040615 A1* | 2/2018 | Chang | H01L 27/0886 |
| 2018/0047831 A1* | 2/2018 | Xie | F17C 1/00 |
| 2018/0083002 A1* | 3/2018 | Kim | H01L 21/76825 |
| 2018/0096935 A1* | 4/2018 | Kim | H01L 27/1211 |
| 2018/0096992 A1* | 4/2018 | Bi | H01L 21/31144 |
| 2018/0145131 A1 | 5/2018 | Wang et al. | |
| 2018/0151439 A1* | 5/2018 | Huang | H01L 21/823418 |
| 2018/0323192 A1* | 11/2018 | Li | H01L 29/7853 |
| 2018/0366375 A1* | 12/2018 | Chen | H01L 29/78696 |
| 2019/0013314 A1 | 1/2019 | Choi et al. | |
| 2019/0019877 A1* | 1/2019 | Seo | H01L 27/0886 |
| 2019/0019890 A1* | 1/2019 | Ko | H01L 29/66545 |
| 2019/0051751 A1 | 2/2019 | Basker et al. | |
| 2019/0067120 A1* | 2/2019 | Ching | H01L 29/7831 |
| 2019/0096765 A1 | 3/2019 | Ching et al. | |
| 2019/0164808 A1 | 5/2019 | Hattendorf et al. | |
| 2019/0287859 A1* | 9/2019 | Huang | H01L 21/823418 |
| 2019/0287971 A1* | 9/2019 | Lee | H01L 21/823821 |
| 2019/0341297 A1* | 11/2019 | Lilak | H01L 21/823481 |
| 2019/0355721 A1 | 11/2019 | Jambunathan et al. | |
| 2020/0006228 A1* | 1/2020 | Yang | H01L 21/76829 |
| 2020/0091277 A1* | 3/2020 | Liu | H01L 21/823481 |

\* cited by examiner

FIN DAMAGE REDUCTION DURING PUNCH THROUGH IMPLANTATION OF FINFET DEVICE

FIELD OF THE DISCLOSURE

The present disclosure relates to semiconductor devices, and more particularly, to methods of forming finFET devices resulting in reduced fin damage.

BACKGROUND OF THE DISCLOSURE

A FinFET is a field effect transistor including a narrow, active area of a semiconductor material protruding from a substrate so as to resemble a fin. The fin includes source and drain regions. Active areas of the fin are separated by shallow trench isolation (STI), such as $SiO_2$. The FinFET also includes a gate region located between the source and the drain regions. The gate region is formed on a top surface and sidewalls of the fin so the gate region wraps around the fin. The portion of the fin extending under the gate between the source region and the drain region is the channel region.

One type of FinFET is fabricated on silicon on insulator (SOI) wafers. One advantage of SOI FinFETs the low leakage current from source to drain due to the oxide layer below the fin blocking the leakage current. Another type of FinFET is fabricated on conventional bulk silicon wafers. These FinFETs are known as bulk FinFETs. Fabricating FinFETs on conventional bulk Si wafers can be considered advantageous for two reasons: (i) the lower cost of bulk wafers and (ii) the option to co-integrate conventional planar bulk FETs and FinFETs in a single product.

In FinFETs, the source and the drain region are heavily doped. The source and the drain regions have a first conductivity type (n-type for NMOS and p-type for PMOS). A problem with existing bulk FinFETs is the presence of a leakage path from source to drain through the part of the fin not controlled by the gate, i.e., the portion of the fin below the gate and adjacent to the STI. The leakage from source to drain through the lower part of the fin is known as punch-through leakage. Punch-through leakage causes an undesirable increase of static power consumption.

In order to solve the problem of punch-through leakage in bulk FinFETs, a lower portion of the fin is doped to have a conductivity type opposite the conductivity type of the source and drain regions (p-type for NMOS; n-type for PMOS). The punch-though-stopper (PTS) dopant is implanted in the part of the fin directly below the channel and below the source and drain regions. Conventionally, well/PTS implantation is conducted after fin/STI formation, resulting in Si lattice damage to the fin from ion scattering due to the $SiO_2$ layer encapsulation of the fins.

Therefore, there is a need for further methods of forming finFET devices resulting in reduced fin damage.

SUMMARY OF THE DISCLOSURE

In one approach, a method may include providing a semiconductor device including a substrate and a plurality of fins extending from the substrate, and forming a source trench isolation (STI) material over the semiconductor device. The method may further include recessing the STI material to reveal an upper portion of the plurality of fins, implanting the semiconductor device, and forming a capping layer over the plurality of fins and the STI material. The method may further include removing a first fin section of the plurality of fins and a first portion of the capping layer, wherein a second fin section of the plurality of fins remains following removal of the first fin section.

In another approach, a method of forming a semiconductor device may include providing a semiconductor device including a substrate and a plurality of fins extending from the substrate, and forming a source trench isolation (STI) material over the semiconductor device. The method may further include recessing the STI material to reveal an upper portion of the plurality of fins, implanting the semiconductor device, and forming a capping layer over the plurality of fins and the STI material. The method may further include performing a fin cut by removing a first fin section of the plurality of fins and a first portion of the capping layer, wherein a second fin section of the plurality of fins remains following removal of the first fin section.

In another approach, a method of forming a finFET device may include providing a semiconductor device including a substrate and a plurality of fins extending from the substrate, and forming a source trench isolation (STI) material between the plurality of fins. The method may further include recessing the STI material to reveal an upper portion of the plurality of fins, wherein a lower portion of the plurality of fins remains covered by the STI material, implanting the semiconductor device, and forming a capping layer over the plurality of fins and the STI material. The method may further include performing a fin cut by removing a first fin section of the plurality of fins and a first portion of the capping layer, wherein a second fin section of the plurality of fins remains following removal of the first fin section.

Figure 1:
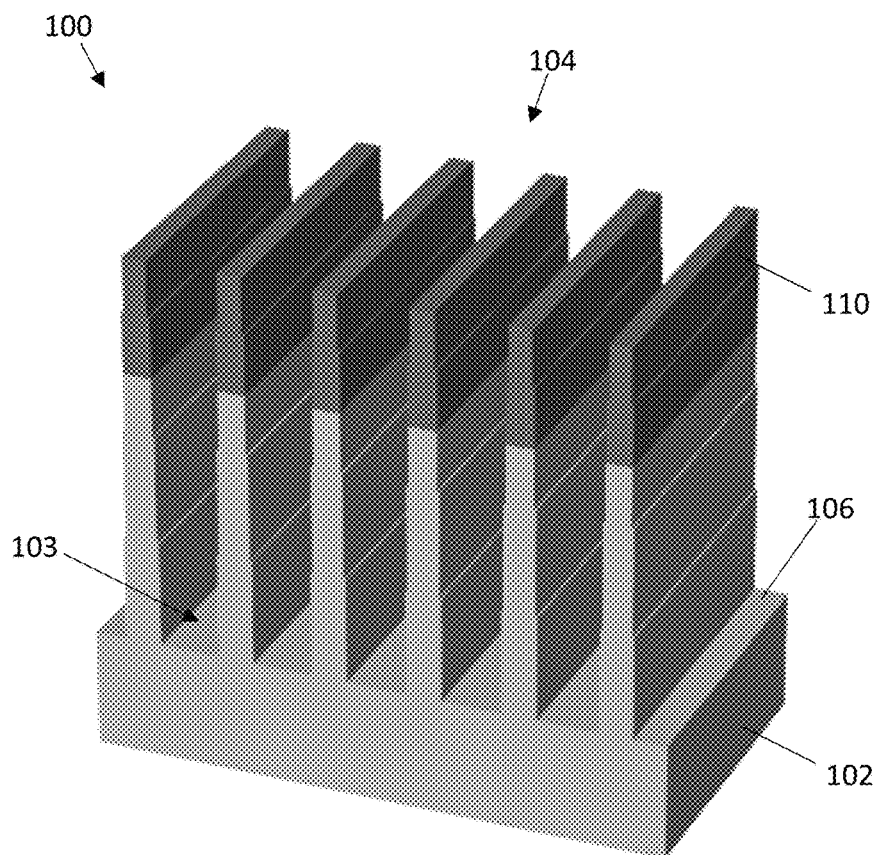
FIG. 1 depicts a perspective view of a semiconductor device in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

FIG. 1 depicts a perspective view of a semiconductor device (hereinafter "device") 100 in accordance with embodiments of the present disclosure. The device 100 may include a substrate 102 and a plurality of fins 104 extending from the substrate 102. As shown, the plurality of fins 104 extends approximately perpendicularly from a top surface 106 of the substrate 102. The plurality of fins 104 may constitute fin structures formed into fin-type field effect transistors (finFETs). As shown, the plurality of fins 104 may include a hardmask layer 110, such as SiN, formed thereon.

The plurality of fins 104 may be semiconductor strips formed in the substrate 102. In some embodiments, the plurality of fins 104 may be formed in the substrate 102 by etching trenches 103 in the substrate 102. The etching may be any acceptable etch process, such as a reactive ion etch (RIE), neutral beam etch (NBE), the like, or a combination thereof. The etch may be anisotropic.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 2:
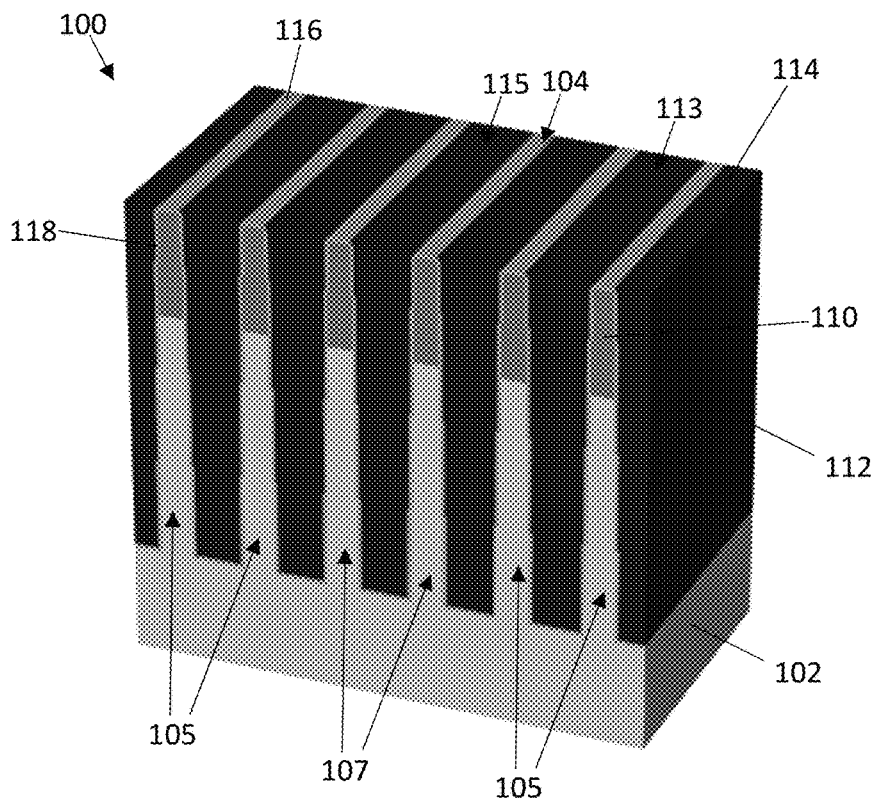
FIG. 2 depicts a perspective view of the semiconductor device of FIG. 1 following formation of a source trench isolation (STI) material in accordance with embodiments of the present disclosure.

FIG. 2 depicts a perspective view of the device 100 following formation of a source trench isolation (STI) material 112 in accordance with embodiments of the present disclosure. The STI material 112 may be an insulation material formed over the device 100, including between neighboring fins of the plurality of fins 104, to form isolation regions. As will be described in greater detail below, the plurality of fins 104 may include a first fin section 105 and a second fin section 107. The STI material 112 may include a first portion 113 and a second portion 115.

The insulation material of the STI material 112 may be an oxide, such as silicon oxide, a nitride, the like, or a combination thereof. The insulation material may be formed by a high density plasma chemical vapor deposition (HDP-CVD), a flowable CVD (FCVD) (e.g., a CVD-based material deposition in a remote plasma system and post curing to convert to another material, such as an oxide), the like, or a combination thereof. Other insulation materials formed by any acceptable process may be used.

In the illustrated embodiment, the insulation material of the STI material 112 may be silicon oxide formed by a FCVD process. An anneal process may be performed once the insulation material is formed. In some embodiments, a planarization process, such as a chemical mechanical polish (CMP), may remove any excess insulation material and form a top surface 114 of the STI material 112. The top surface 114 of the STI material 112 may be level or planar with a top surface 116 of plurality of fins 104. In some embodiments, prior to formation of the STI material 112, a dielectric layer 118 may be formed over the plurality of fins 104. The dielectric layer 118 prevents oxidation of the plurality fins 104 during formation of the STI material 112. The dielectric layer 118 may be, for example, silicon oxide, silicon nitride, a combination thereof, or the like, and may be deposited or thermally grown according to acceptable techniques. In some embodiments, the dielectric layer 118 and the hardmask layer 110 may be the same or different materials.

Figure 3:
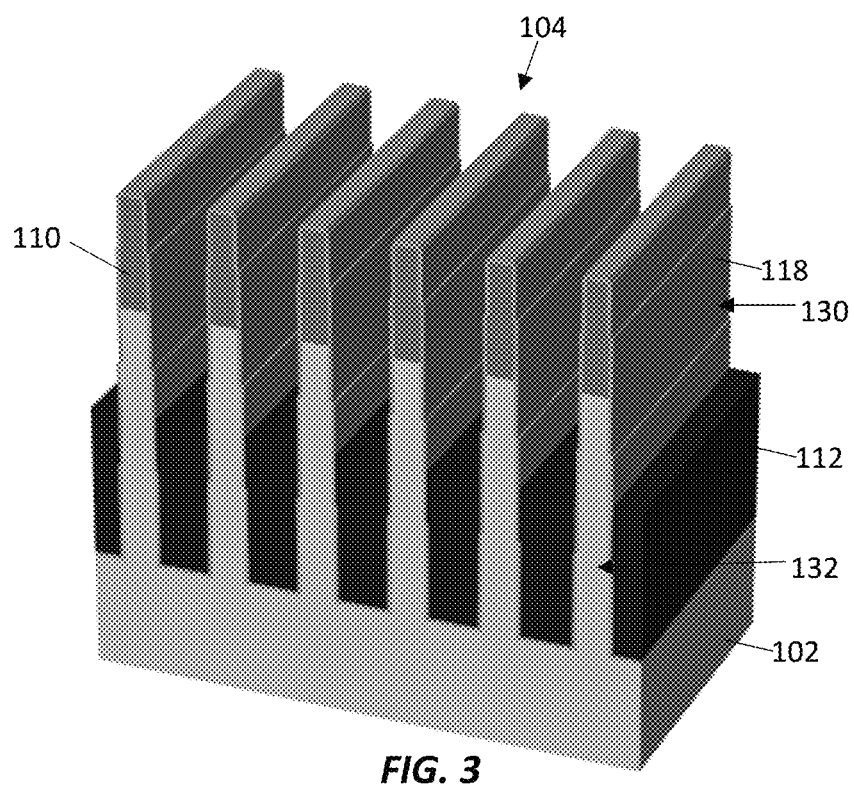
FIG. 3 depicts a perspective view of the semiconductor device of FIG. 2 following recessing of the STI material in accordance with embodiments of the present disclosure.

FIG. 3 depicts a perspective view of the device 100 following recessing of the STI material 112 in accordance with embodiments of the present disclosure. As shown, the STI material 112 may be removed/recessed to expose just an upper portion 130 of the plurality of fins. In some embodiments, a bottom portion 132 of the plurality of fins 104 remains covered by the STI material 112. As shown, the STI material 112 may be removed selective to the dielectric layer 118 disposed along the plurality of fins 104. In some embodiments, the STI material may be removed using an acceptable etch process, such as a reactive ion etch (RIE), neutral beam etch (NBE), or a combination thereof. The etch may be anisotropic.

Figure 4A:
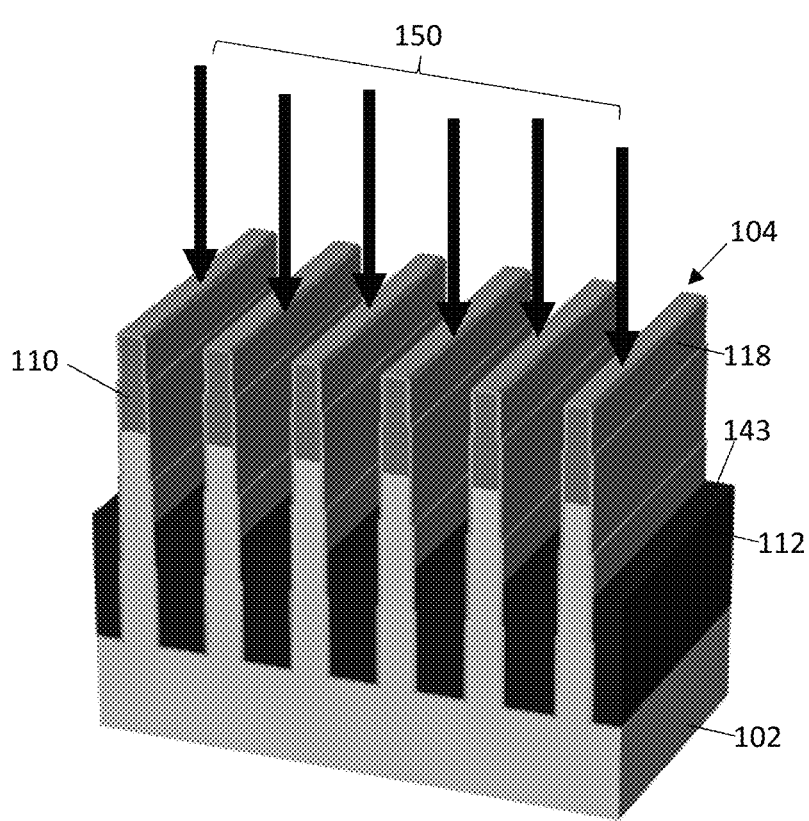
FIGS. 4A-4B depict perspective views of the semiconductor device of FIG. 3 following implantation of the semiconductor device in accordance with embodiments of the present disclosure.
Figure 4B:
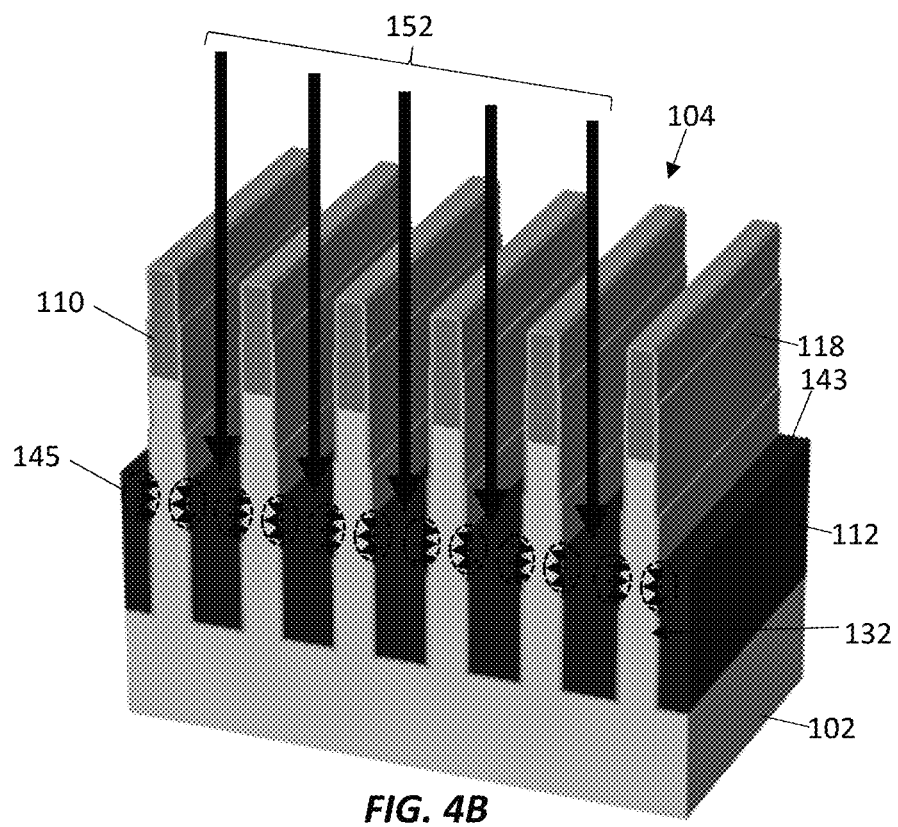

FIGS. 4A-4B depict perspective views of the device 100 following implantation of the semiconductor device in accordance with embodiments of the present disclosure. The implantation may be a well/PTS dopant implantation process. In the embodiment of FIG. 4A, the implantation 150 may be directed into the plurality of fins 104 and the STI material 112. In the embodiment of FIG. 4B, the implantation 152 may be directed into just the STI material 112. As there is no STI material 112 adjacent the active-fin, e.g., along the upper portion 130, there is no implant damage to the plurality of fins 104 by a scattering effect happening during the implantation 152. In conventional approaches, the implantation can be done while the STI material is adjacent the active-fins, resulting in scattering in the STI materials. Scattering may reach the active-fins, causing damage, and degrades device performance.

In the embodiment of FIG. 4B, the vertical implantation 152 may be delivered to the STI materials 112 and scattered near the upper surface 143 thereof. The scattering may reach the sub active-fin areas (i.e., the bottom portion 132 of the plurality of fins 104, below the upper surface 143) laterally, thus inducing a doping to the sub-fin area and effectively performing as a PTS doping. In the embodiment of FIG. 4B, there is no doping effect to the active-fin area, resulting in better device performance. As there is no STI materials 112 above the active-fin area, implant energy can be lowered (compared to conventional way) to minimize the damage on sub-fin area while doing the PTS doping 145 using the scattering effect in STI materials 112.

Figure 5:
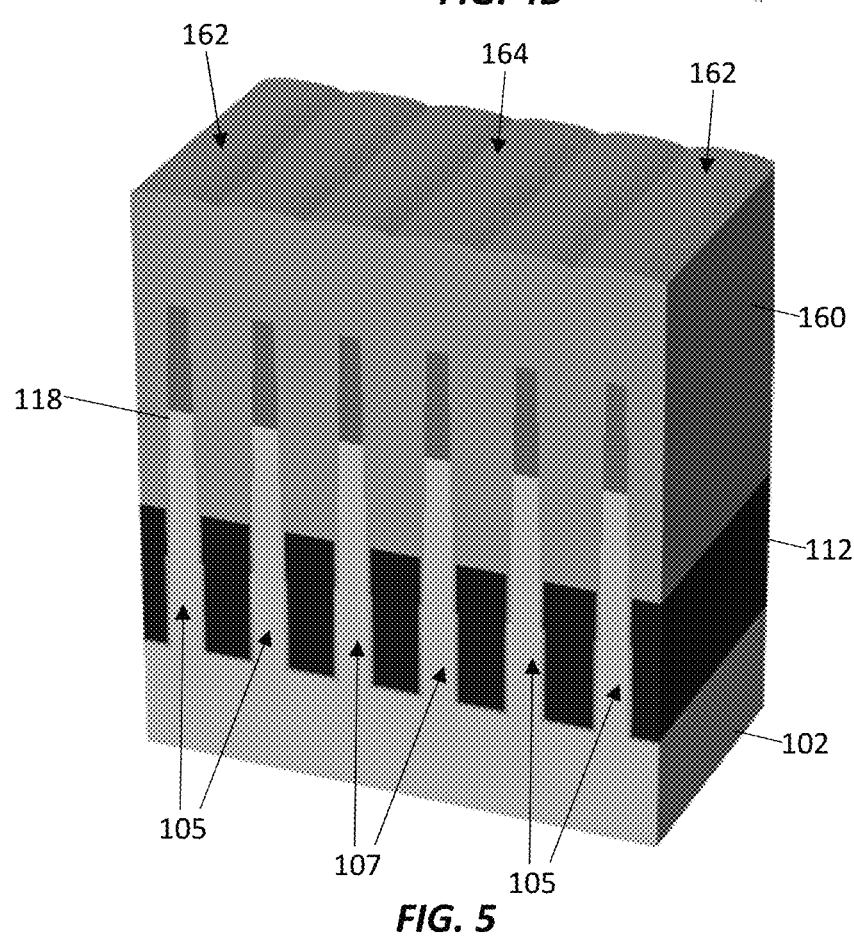
FIG. 5 depicts a perspective view of the semiconductor device of FIG. 4A or FIG. 4B following formation of a capping layer in accordance with embodiments of the present disclosure.

FIG. 5 depicts a perspective view of the device 100 following formation of a capping layer 160 in accordance with embodiments of the present disclosure. As shown, the capping layer 160 may be deposited over the plurality of fins 104 and over the STI material 112. The capping layer 160 may include a first portion 162 over/above the first fin section 105, and a second portion 164 over/above the second fin section 107. One will be appreciate the first portion 162 and the second portion 164 of the capping layer 160 may be part of a continuous layer. In some embodiments, the capping layer 160 may be SiN or other suitable material.

Figure 6:
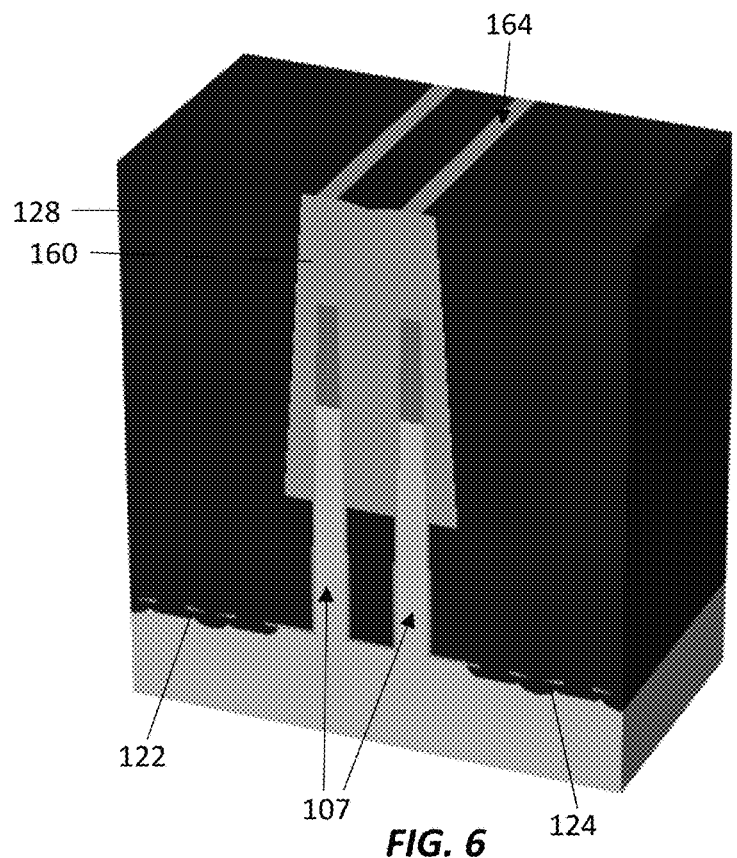
FIG. 6 depicts a perspective view of the semiconductor device of FIG. 5 following a fin cut and formation of a second STI material in accordance with embodiments of the present disclosure.

FIG. 6 depicts a perspective view of the device 100 following a fin cut process in accordance with embodiments of the present disclosure. As shown, performing the fin cut may include removing the first portion 162 of the capping layer 160 above the first fin section 105. The second portion 164 of the capping layer 160 above the second fin section 107 may remain following the fin cut. In some embodiments, the second fin section 107 may include a pair of fins, wherein the second portion 164 of the capping layer 160 remains between, and above, the pair of fins following the fin cut. The first fin section 105 and the first portion 162 of the capping layer 160 may be removed using an acceptable etching process. As shown, the etch process of the fin cut may recess the substrate 102 to form wells 122 and 124.

Following the fin cut, a second STI material 128 may be formed over the device 100. As shown, the second STI material 128 may be formed over the second fin section 107 and within the wells 122, 124. Although not shown, the second STI material 128 may be formed over the device 100 and then recessed or removed until planar with a top surface of the second portion 164 of the capping layer 160. In some embodiment, the second STI material 128 may be removed using a planarization process, such as CMP.

The second STI material 128 may be an insulation material such as silicon oxide, a nitride, the like, or a combination thereof. The insulation material may be formed by a high-density plasma chemical vapor deposition (HDP-CVD), a flowable CVD (FCVD) (e.g., a CVD-based material deposition in a remote plasma system and post curing to convert to another material, such as an oxide), the like, or a combination thereof. Other insulation materials formed by any acceptable process may be used. In various embodiments, the STI material 112 and the second STI material 128 may be the same or different.

Figure 7:
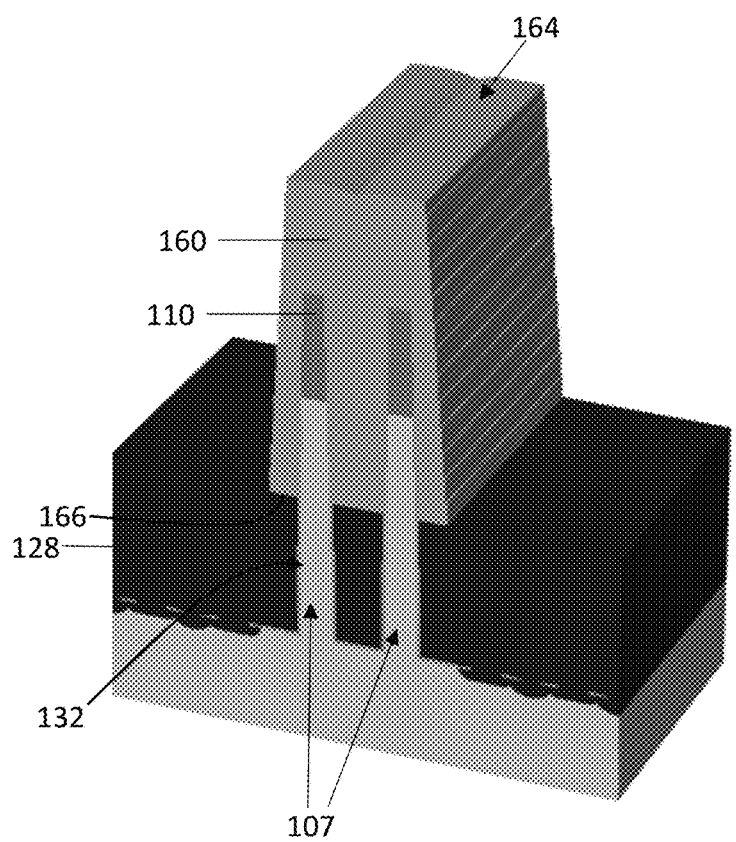
FIG. 7 depicts a perspective view of the semiconductor device of FIG. 6 following recessing of the second STI material in accordance with embodiments of the present disclosure.

FIG. 7 depicts a perspective view of the device 100 following recessing of the second STI material 128 in accordance with embodiments of the present disclosure. As shown, the second STI material 128 is recessed to reveal the second portion 164 of the capping layer 160. The second STI material 128 may be etched to a lower portion or edge 166 of the capping layer 160. In some embodiments, the second STI material 128 is removed to expose an entire vertical height of the capping layer 160. As shown, a bottom portion 132 of the second fin section 107 remains sandwiched by the second STI material 128.

Figure 8:
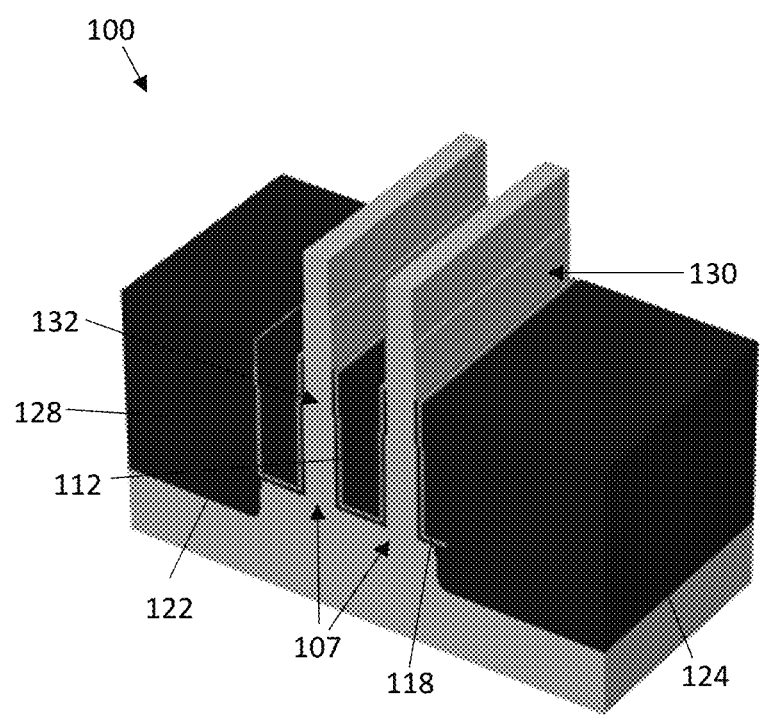
FIG. 8 depicts a perspective view of the semiconductor device of FIG. 7 following removal of a portion of the capping layer in accordance with embodiments of the present disclosure.

FIG. 8 depicts a perspective view of the device 100 following removal of the capping layer 160 and the hardmask layer 110 in accordance with embodiments of the present disclosure. The hardmask layer 110 and the capping layer 160 may stripped away to expose the upper portion 130 of the second fin section 107. When present, the dielectric layer 118 may also be removed from the upper portion 130 of the second fin section 107. In some embodiments, the lower portion 132 of the second fin section 107 may remain covered by the STI material 112, the second STI material 128.

Figure 9:
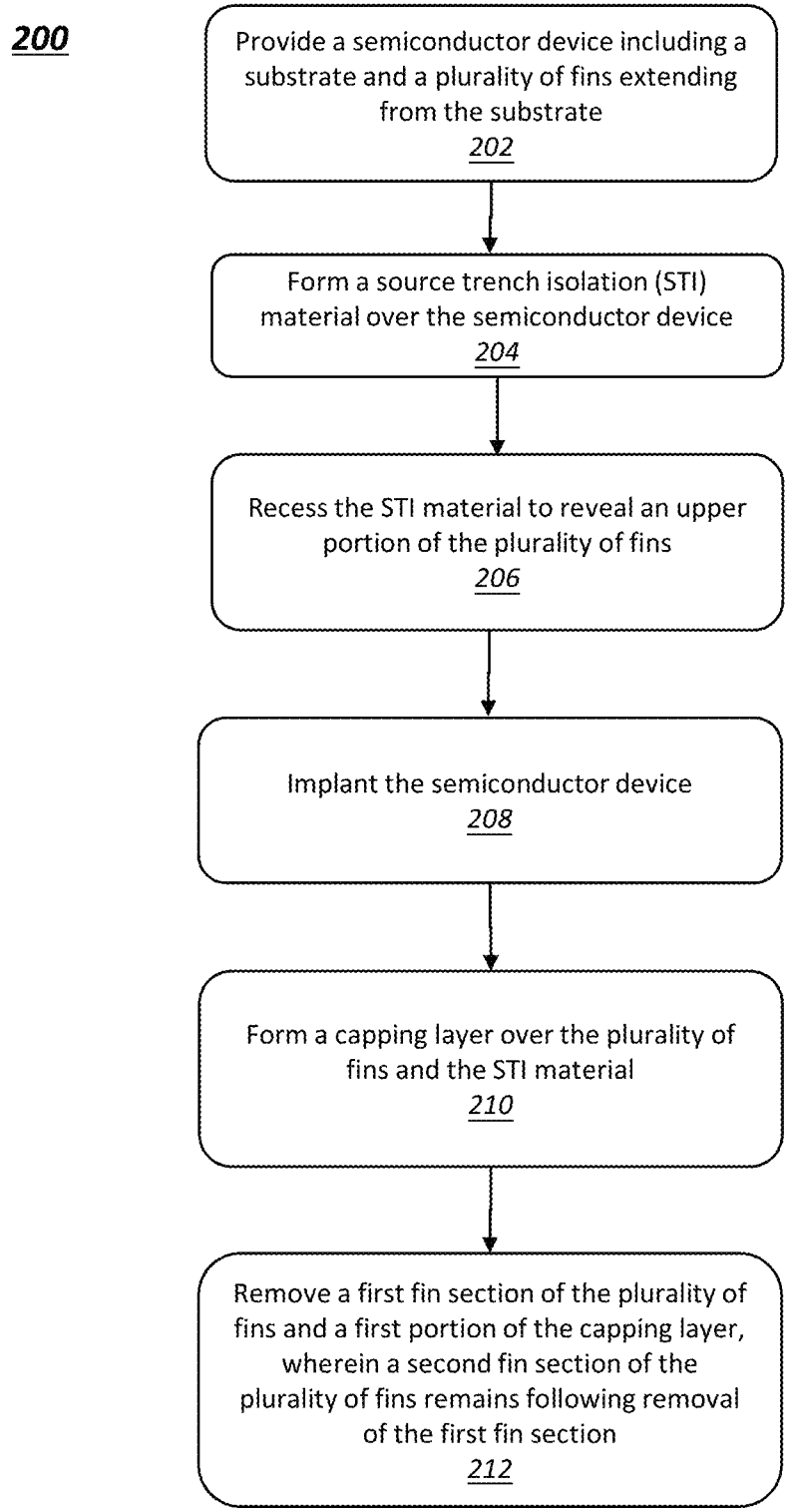
FIG. 9 depicts a process flow in accordance with embodiments of the disclosure.

FIG. 9 depicts a method 200 according to embodiments of the present disclosure will be described in greater detail. Specifically, at block 202, the method 200 includes providing a semiconductor device including a substrate and a plurality of fins extending from the substrate. At block 204, the method includes forming a source trench isolation (STI) material over the semiconductor device. At block 206, the method includes recessing the STI material to reveal an upper portion of the plurality of fins. At block 208, the method 200 includes implanting the semiconductor device. At block 210, the method 200 includes forming a capping layer over the plurality of fins and the STI material. At block 212, the method 200 includes removing a first fin section of the plurality of fins and a first portion of the capping layer, wherein a second fin section of the plurality of fins remains following removal of the first fin section.

Although the illustrative method 200 is described as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 200 may be implemented in association with the formation and/or processing of structures illustrated and described herein as well as in association with other structures not illustrated.

In various embodiments, design tools can be provided and configured to create the datasets used to pattern the semiconductor layers of the devices 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In view of the foregoing, at least the following technical benefits/advantages are achieved by the embodiments disclosed herein. Firstly, unlike conventional processes where well/PTS implantation is conducted after the fin cut and STI formation, embodiments herein provide well/PTS implantation after recessing the STI material to define active fin height, thus effectively preventing fin damage. Secondly, performing well/PTS implantation after recessing the STI material leads to higher device yield with reduced channel effect.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a semiconductor device including a substrate and a plurality of fins extending from the substrate;
forming a dielectric layer over the plurality of fins, wherein the dielectric layer extends along a sidewall of each of the plurality of fins and along a top surface of the substrate extending between each of the plurality of fins;
forming a source trench isolation (STI) material over the dielectric layer;
recessing the STI material to reveal an upper portion of the plurality of fins;
implanting the semiconductor device;
forming a capping layer over the plurality of fins and the STI material; and
removing a first fin section of the plurality of fins and a first portion of the capping layer, wherein a second fin section of the plurality of fins remains following removal of the first fin section.

2. The method of claim 1, further comprising removing a first portion of the capping layer above the first fin section, wherein a second portion of the capping layer above the second fin section remains following removal of the first portion of the capping layer.

3. The method of claim 2, further comprising
forming a second STI material over the semiconductor device; and
recessing the second STI material to reveal the second portion of the capping layer.

4. The method of claim 3, further comprising removing the second portion of the capping layer from the second fin section of the plurality of fins.

5. The method of claim 3, further comprising providing a hardmask layer atop the plurality of fins.

6. The method of claim 5, further comprising removing the hardmask layer after the second STI material is recessed.

7. The method of claim 1, wherein implanting the semiconductor device comprising implanting just the STI material between the plurality of fins.

8. The method of claim 1, further comprising performing a fin cut by recessing the substrate.

9. A method of forming a semiconductor device, comprising:
providing a semiconductor device including a substrate and a plurality of fins extending from the substrate;
forming a dielectric layer over the plurality of fins, wherein the dielectric layer extends along a sidewall of each of the plurality of fins and along a top surface of the substrate extending between each of the plurality of fins;
forming a source trench isolation (STI) material over the dielectric layer;
recessing the STI material to reveal an upper portion of the plurality of fins;
implanting the semiconductor device;
forming a capping layer over the plurality of fins and the STI material; and
performing a fin cut by removing a first fin section of the plurality of fins and a first portion of the capping layer, wherein a second fin section of the plurality of fins remains following removal of the first fin section.

10. The method of claim 9, wherein performing the fin cut further comprises removing a first portion of the capping layer above the first fin section, and wherein a second portion of the capping layer above the second fin section remains following removal of the first portion of the capping layer.

11. The method of claim 10, further comprising:
forming a second STI material over the semiconductor device; and
recessing the second STI material to reveal the second portion of the capping layer.

12. The method of claim 11, further comprising removing the second portion of the capping layer from the second fin section of the plurality of fins.

13. The method of claim 11, further comprising providing a hardmask layer atop the plurality of fins, wherein the hardmask layer is removed after the second STI material is recessed.

14. The method of claim 9, wherein implanting the semiconductor device comprising implanting just the STI material between the plurality of fins.

15. A method of forming a finFET device, comprising:
providing a semiconductor device including a substrate and a plurality of fins extending from the substrate;
forming a dielectric layer over the plurality of fins, wherein the dielectric layer extends along a sidewall of each of the plurality of fins and along a top surface of the substrate extending between each of the plurality of fins;
forming a source trench isolation (STI) material between the plurality of fins, wherein the STI material is formed over the dielectric layer;
recessing the STI material to reveal an upper portion of the plurality of fins, wherein a lower portion of the plurality of fins remains covered by the STI material;
implanting the semiconductor device;
forming a capping layer over the plurality of fins and the STI material; and
performing a fin cut by removing a first fin section of the plurality of fins and a first portion of the capping layer, wherein a second fin section of the plurality of fins remains following removal of the first fin section.

16. The method of claim 15, wherein performing the fin cut further comprises removing a first portion of the capping layer above the first fin section, and wherein a second portion of the capping layer above the second fin section remains following removal of the first portion of the capping layer.

17. The method of claim 16, further comprising:
forming a second STI material over the semiconductor device; and
recessing the second STI material to reveal the second portion of the capping layer.

18. The method of claim 17, further comprising removing the second portion of the capping layer from the second fin section of the plurality of fins.

* * * * *